(12) United States Patent
Gorisse et al.

(10) Patent No.: US 11,601,107 B2
(45) Date of Patent: Mar. 7, 2023

(54) METHOD FOR THE PRODUCTION OF A BULK ACOUSTIC WAVE RESONATOR WITH A REDUCED PARASITIC CAPACITANCE

(71) Applicant: COMMISSARIAT A L'ENERGIE ATOMIQUE ET AUX ENERGIES ALTERNATIVES, Paris (FR)

(72) Inventors: Marie Gorisse, Voiron (FR); Alexandre Reinhardt, Saint-Martin d'Heres (FR); Lamine Benaissa, Massy (FR); Jean-Sébastien Moulet, Chambery (FR)

(73) Assignee: COMMISSARIAT A L'ENERGIE ATOMIQUE ETAUX ENERGIES ALTERNATIVES, Paris (FR)

( * ) Notice: Subject to any disclaimer, the term of this patent is extended or adjusted under 35 U.S.C. 154(b) by 60 days.

(21) Appl. No.: 16/956,375

(22) PCT Filed: Dec. 21, 2018

(86) PCT No.: PCT/FR2018/053517
§ 371 (c)(1),
(2) Date: Jun. 19, 2020

(87) PCT Pub. No.: WO2019/129979
PCT Pub. Date: Jul. 4, 2019

(65) Prior Publication Data
US 2021/0091742 A1 Mar. 25, 2021

(30) Foreign Application Priority Data
Dec. 26, 2017 (FR) ...................................... 1763228

(51) Int. Cl.
*H03H 3/02* (2006.01)
*H03H 9/02* (2006.01)
(Continued)

(52) U.S. Cl.
CPC .......... *H03H 3/02* (2013.01); *H03H 9/02015* (2013.01); *H03H 9/02125* (2013.01);
(Continued)

(58) Field of Classification Search
CPC .. H03H 3/02; H03H 9/02015; H03H 9/02125; H03H 9/02157; H03H 9/131;
(Continued)

(56) References Cited

U.S. PATENT DOCUMENTS 9,525,397 B2 * 12/2016 Burak .................... H03H 9/171
2003/0199105 A1 10/2003 Kub et al.
(Continued)

FOREIGN PATENT DOCUMENTS

| DE | 10315239 A1 | 10/2004 |
| JP | 2008154240 A | 7/2008 |
| WO | 2010004534 A1 | 1/2010 |

OTHER PUBLICATIONS

International Search Report for International Application No. PCT/FR2018/053517, dated Jun. 14, 2019.
(Continued)

*Primary Examiner* — Rakesh B Patel
*Assistant Examiner* — Jorge L Salazar, Jr.
(74) *Attorney, Agent, or Firm* — Pearne & Gordon LLP (57) ABSTRACT

A method for producing an adjustable bulk acoustic wave resonator comprising a transducer stack (E1) and a tuning stack (E2). According to the invention, transducer stack (E1) includes two defined electrodes (4, 6) and piezoelectric material (2), and stack (E2) includes a layer of piezoelectric material (8) and two defined electrodes (10, 12). The method includes: a) production of the transducer stack; b) formation of an electrically insulating layer on an electrode (6) of the transducer stack; c) formation of a defined electrode (10) of the tuning stack on the electrically insulting layer such that
(Continued)

it is aligned with the electrodes of the transducer stack; d) assembly, on the electrode (10), of a substrate of piezoelectric material; e) fracturing of the substrate of piezoelectric material; and f) formation of the other defined electrode (12) of the tuning stack, aligned with the defined electrode (10).

17 Claims, 10 Drawing Sheets

(51) Int. Cl.
*H03H 9/13* (2006.01)
*H03H 9/17* (2006.01)

(52) U.S. Cl.
CPC ........ *H03H 9/02157* (2013.01); *H03H 9/131* (2013.01); *H03H 9/175* (2013.01); *H03H 2003/025* (2013.01)

(58) Field of Classification Search
CPC ............. H03H 9/175; H03H 2003/025; H03H 2003/021; H03H 2009/02204; H03H 9/02031; H03H 9/02055; H03H 9/173; H03H 9/584; H03H 9/585; H01L 21/76254
USPC .......................................... 333/133, 187, 188
See application file for complete search history.

(56) References Cited

U.S. PATENT DOCUMENTS

| | | |
|---|---|---|
| 2008/0011699 A1 | 1/2008 | Lyons |
| 2013/0119491 A1 | 5/2013 | Luce et al. |
| 2013/0285248 A1 | 10/2013 | Yin et al. |
| 2016/0126215 A1 | 5/2016 | Imbert et al. |
| 2016/0182009 A1 | 6/2016 | Bhattacharjee |
| 2017/0179925 A1 | 6/2017 | Kishimoto |
| 2018/0294790 A1 | 10/2018 | Timme et al. |
| 2019/0198397 A1 | 6/2019 | Andrieu et al. |
| 2020/0020561 A1 | 1/2020 | Benaissa |
| 2020/0020663 A1 | 1/2020 | Benaissa et al. |
| 2020/0161336 A1 | 5/2020 | Lamy et al. |

OTHER PUBLICATIONS

Written Opinion for International Application No. PCT/FR2018/053517, dated Jun. 14, 2019.
Preliminary French Search Report for Application No. 1763228, dated Aug. 9, 2018.
International Preliminary Report on Patentability for PCT/FR2018/053517 dated Apr. 8, 2020.
Specification and Drawings for U.S. Appl. No. 16/493,560 entitled "Saw Resonator Comprising Layers For Attenuating Parasitic Waves", filed Mar. 9, 2018.
Frederick, Amanda A. et al. "Frequency tuning of film bulk acoustic resonators", Proceedings of SPIE, 2018, vol. 6172 pp. 617203-1-617203-8.
Imbert, B, et al. "LiNbO$_3$ thin single crystal layer for RF applications", IEEE Frequency Control the European Frequency and Time Forum, May 2011, p. 1-4.
Lakin, Kenneth M. "Thin Film Resonator Technology", IEEE Transactions On Ultrasonics, Ferroelectrics, And Frequecy Control, May 2005, vol. 52, No. 5, pp. 707-716.
Reinhardt, Alexandre et al. "Tunable composite piezoelectric resonators: a possible "Holy Grail" of RF filters" IN: IEEE, 2012.
Pijolat, M. et al. LiNbO$_3$ Film Bulk Acoustic Resonator: IN: IEEE, 2010 pp. 661-664.

* cited by examiner

FIG.9E

METHOD FOR THE PRODUCTION OF A BULK ACOUSTIC WAVE RESONATOR WITH A REDUCED PARASITIC CAPACITANCE

CROSS-REFERENCE TO RELATED APPLICATIONS

This is a National Stage application of PCT international application PCT/FR2018/053517, filed on Dec. 21, 2018, which claims the priority of French Patent Application No. 17 63228, filed Dec. 26, 2017, both of which are incorporated herein by reference in their entireties.

TECHNICAL FIELD AND STATE OF PRIOR ART

The present invention relates to a method for the production of a resonator with a reduced parasitic capacitance, for example a bulk acoustic wave resonator.

For example, it is desired to make adjustable radiofrequency (RF) filters, for example for mobile telephony, enabling the number of filters implemented in a cellular phone to be decreased, by using a same filter to address several frequency bands.

Such RF filters already exist, they are for example Bulk Acoustic Wave (BAW) filters, but they are not adjustable.

A bulk acoustic wave filter includes a layer of piezoelectric material, an electrode on a face of the piezoelectric layer and an electrode on the other face. In order to control the resonator properties, electrodes are delimited, for example by etching; therefore, they do not cover the entire face of the piezoelectric layer on which they are formed.

In order to obtain an adjustable bulk acoustic wave filter, another stack, including a layer of piezoelectric material and electrodes on either side of the piezoelectric layer, is disposed on the stack already made, and insulated from the same by an electrically insulating material.

The first stack creates resonance, it is called a transduction layer, and the second stack enables conditions for the propagation of the wave generated by the first stack to be modified, it is called a tuning layer.

Additionally, it is attempted to make use, for the transduction and tuning layers, of waves having a strong electromechanical coupling, for example for enabling synthesis of band pass filters fulfilling mobile telephony requirements, on the one hand, and a significant frequency agility on the other hand. This strong coupling can be achieved by using materials having strong piezoelectric properties. For example, lithium niobate or $LiNbO_3$, also designated as LNO, of X-cut, i.e. having a crystal direction X perpendicular to the plane of the substrate, enables a theoretical electromechanical coupling of 45% to be achieved for target modes. Another interesting crystal orientation is the so-called Y+163°-cut, in which the crystal axis X is in the plane, whereas the axis Y is tilted by an angle of 163° with respect to the normal to the substrate. This orientation enables waves having electromechanical coupling coefficients lower than the X-cut (in the order of 35%) to be excited, but only enables a single wave to be excited at a time, which leads to a reduction in the number of parasitic resonances.

In an application to mobile telephony, target frequencies are of a few hundred MHz to a few GHz. For this, the piezoelectric layers have to be very thin, for example of a few hundred nanometres, the thickness depending on the desired frequency.

LNO layers with such thicknesses and having a given crystal orientation can not be made by deposition. The production of two stacks is then achieved either by transfer by implantation, direct bonding and fracturing, or by transfer by direct bonding and thinning.

For the filter to properly operate, thicknesses of both stacks should keep a ratio calculated as a function of desired parameters for the resonator. But, in view of intended thicknesses which are of a few hundred nm, the deposition of LNO having a crystallographic axis perpendicular to the plane of the stack is not contemplatable. LNO layers of a few hundred nm having this orientation are obtained by implantation, direct bonding and fracturing.

Such an adjustable filter is currently made from a first, a second and a third substrate.

Steps of producing electrodes on the substrates, bonding the substrates and fracturing then take place.

The stack includes four superimposed electrodes. The active zone of the resonator is defined, namely the zone where the four electrodes cover each other. It is inside this zone that waves have the expected behaviour. A very good alignment of the electrodes is searched for in order to control electric characteristics of the stack.

Due to the production method, misalignments build up between the electrodes. In order to have an active zone with a desired surface area at the end of the production method, guards are provided at the electrodes. The electrodes do not have the same dimensions as the active zone. Generally, it is the electrode made last that has the dimensions of the active zone. The other electrodes are provided with a sufficient guard to take misalignments into account.

On the one hand, these guards are detrimental to compactness of the resonator. On the other hand, it has been noticed that portions of the electrodes and of the piezoelectric material of the tuning layers outside the active zone were the equivalent of a parasitic capacitance, which is considered as connected in parallel to an external capacitance used to tune the resonant frequency of the resonator. Its presence thus offsets the frequency tuning setpoint. The frequency agility range of the resonator is thereby limited.

DISCLOSURE OF THE INVENTION

Consequently, a purpose of the present invention is to offer a new method for the production of a structure including two stacks each including at least one element, both elements being aligned with each other.

The purpose previously set out is achieved by a method for the production of a structure including a first stack including at least one first element, a second stack including at least a second element, the first and the second element being aligned with each other, including forming the second element on the first stack such that it is aligned with the first element, and transferring by bonding the rest of the second stack on the structure formed.

According to the invention, the alignment of the first and the second element is for example achieved by lithography and etching and not by alignment of a plate with respect to the other during transfer. The alignment, during a lithography step, enables an accurate alignment to be achieved by means of the use of a mask aligner, or even better, a photorepeater, used in photolithography, without requiring to resort to a dedicated alignment station during bonding.

It is also a purpose of the present invention to offer a method for the production of a bulk acoustic wave resonator offering reduced parasitic capacitances.

The purpose previously set out is achieved by a method for the production of a bulk acoustic wave resonator including at least a first stack comprising a piezoelectric material and two electrodes and a second stack comprising two electrically conducting metal layers on either side of a layer, the alignment of the electrodes and the metal layers is achieved by lithography and etching and not by alignment of a plate with respect to the other during transfer. The alignment, during a lithography step, enables an accurate alignment to be achieved by means of the use of a mask aligner, or even better, a photorepeater, used in photolithography, without requiring to resort to a dedicated alignment station during bonding.

By means of the production method, the guards provided as a precaution to take account of the misalignment of the electrodes can be substantially reduced, which reduces parasitic capacitance. Further, the resonators thus made can be more compact.

In the case of an adjustable bulk acoustic wave filter, the first stack is used for electromechanical transduction, and the second stack can be a tuning layer, each stack including two electrodes. The production method according to the invention provides, after producing the first electrode, producing the other electrodes on a stack already including an electrode, which simplifies alignment.

Advantageously, the piezoelectric material is X-cut or Y+163°-cut lithium niobate or $LiNbO_3$.

In the case of a SMR filter, the second stack can be an acoustic Bragg mirror ensuring mechanical decoupling between the resonator and the substrate. A first electrode is formed on a Bragg mirror, and then after bonding the piezoelectric layer of the resonator, a second electrode is made by lithography and etching by directly aligning on the first electrode.

The method for the production of an acoustic resonator according to the invention implements a bonding layer of dielectric material between an electrode and a piezoelectric layer. Contrary to prejudice relating to the presence of such a layer, it is possible to make a filter keeping the same piezoelectric coupling coefficient, or even an increased coupling coefficient, while keeping the same frequency agility.

Preferably, the thickness of the bonding layer is between 10 nm and 50 nm.

Therefore, one subject-matter of the present invention is a method for the production of a structure including at least one first functional stack and a second functional stack, the first functional stack including at least a first element and a first part, the second functional stack including at least a second element and a second part, the first element being aligned with the second element, said method including:

a) providing a first functional stack, b) forming the second element on the first functional stack such that it is aligned with the first element, c) providing the second stack not including the second element, d) assembling the first functional stack and the second functional stack.

In one exemplary embodiment, the production method includes a step e), after step c), of forming a third element on the second part, so that it is aligned with the second element.

The production method can include, before forming the third element, a step c1) of removing a portion with a given thickness of said substrate of piezoelectric material up to a given thickness.

Preferably, assembling of step d) is direct bonding. For example, step d) includes forming a first bonding layer, for example of $SiO2$, on the second element and a second bonding layer, for example of $SiO2$, on the second stack without the second element, said direct bonding taking place at said bonding layers. The first and second bonding layers are for example such that they form an intermediate layer with a thickness between 10 nm and 50 nm.

The alignments of steps c) and e) can be achieved by only implementing a mask aligner or a photorepeater during a photolithography step.

Advantageously, step c1) is achieved by fracturing the substrate of piezoelectric material, said substrate of piezoelectric material having undergone beforehand an ion implantation at a depth slightly higher than the given thickness of the first layer of piezoelectric material.

In one exemplary embodiment, the first stack includes at least two electrically conducting defined portions forming defined electrodes on either side of a first layer of a piezoelectric material, and the second stack includes a second layer of piezoelectric material and the second and third elements form a first and a second electrodes defined on either side of the second layer of piezoelectric material, wherein the first stack or the second stack form a bulk acoustic wave resonator, and the second or the first stack form means for tuning said resonator, so as to produce an adjustable bulk acoustic wave resonator.

The method can then include the step of forming an electrically insulating layer on one defined of the electrically conducting portions of the first stack.

For example, during step a), the first stack includes a support substrate supporting the electrodes and the first layer of a piezoelectric material.

The production method can include a step f) of structuring the support substrate to form a cavity under the resonator, for example by etching a sacrificial layer.

Advantageously, during step a), the first layer of piezoelectric material is made by ion implantation and fracturing.

In another exemplary embodiment, the first stack includes at least two electrically conducting defined portions on either side of a first layer, and the second stack including a second layer of piezoelectric material and the second and third elements form a first and a second electrodes defined on either side of the first layer of piezoelectric material, said method including a step of forming an electrically insulating layer on one of the defined electrically conducting portions of the first stack, and wherein the first stack includes a layer of given material in contact with the other of the electrically conducting defined portions, on which the electrically insulating layer is not formed, the given material being an electrically insulating material, for example $SiO_2$, so as to form a Bragg mirror and such that the first stack and the second stack form a bulk acoustic wave resonator on a Bragg mirror.

For example, the layer(s) of piezoelectric material is (are) of X-cut lithium niobate or $LiNbO_3$, having advantageously a thickness from 100 nm to several hundred nm. As a variant, the layer(s) of piezoelectric material is (are) of Y+163°-cut lithium niobate or $LiNbO_3$, having advantageously a thickness from 100 nm to several hundred nm.

Another subject-matter of the present invention is a bulk acoustic wave resonator including at least a first stack and a second stack, the first stack including at least two electrically conducting defined portions on either side of a portion of a given material, and the second stack including a first layer of piezoelectric material, a first and a second electrodes defined on either side of the first layer of piezoelectric material, and an intermediate layer of electrically insulating material between the first electrode and the first layer of electric material.

The electrically conducting portions of the second stack are advantageously defined electrodes and the portion of a given material is a piezoelectric material, one of the stacks forming a transducer and the other of the stacks forms frequency tuning means for said transducer.

The first stack can be a Bragg mirror.

BRIEF DESCRIPTION OF THE DRAWINGS

The present invention will be better understood based on the description that follows and the appended drawings in which.

DETAILED DISCLOSURE OF PARTICULAR EMBODIMENTS

The description that follows is mainly but not exclusively concerned with an acoustic resonator. The description of FIGS. 9A to 9E is concerned with the production of a more general structure including at least one first element, a second stack including at least one second element, the first and second element being aligned with each other.

In the present application, by "aligned portions", the portions can be electrodes, it is meant to make a second portion of material which is defined in a layer vertically aligned with a first defined portion of material of a stack, such that the distance between the external perimeter of the projection of the second portion in the plane of the first portion and the external perimeter of the first portion is lower than 2 µm, advantageously lower than 500 nm, and even more advantageously lower than 250 nm. The term "aligned elements" is synonymous with "aligned portions".

By "defined portion" or "defined electrode", it is meant a portion or electrode made from a layer by photolithography and etching and having an external perimeter, as opposed to a full-plate layer or full-plate electrode which extends on the entire stack.

Further, by "functional stack", it is meant a stack which provides a function, for example in a non-limiting way, an actuator function, a filter function, a transduction function, a tuning function, a resonator function, a Bragg mirror function, a sensor function, a read circuit function.

Figure 1:
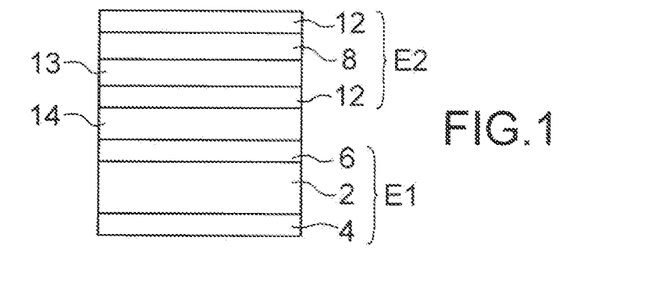
FIG. 1 is a schematic representation of an example of adjustable bulk acoustic wave filter obtained by an exemplary method according to the invention.

In FIG. 1, an exemplary embodiment of an adjustable bulk acoustic wave resonator according to the invention including two stacks E1, E2 can be seen.

The stack E1 is designated as transducer and includes a layer 2 of piezoelectric material, an electrode 4 on a face of the layer 2 and an electrode 6 on the other face of the layer 2. Electrodes 4, 6 include an active part for transduction and one or more contact parts for connecting the active part to an external circuit.

Electrodes 4 and 6 are defined and aligned with each other at the active zone.

Stack E2 is designated as tuning stack, it includes a layer 8 of piezoelectric material, an electrode 10 on a face of the layer 8 and an electrode 12 on the other face of the layer 8. Electrodes 10 and 12 are vertically aligned with each other and have substantially the same surface area, at the active zone.

Stack E2 also includes an intermediate layer 13 interposed between the electrode 10 and the piezoelectric layer 8. This layer is a layer which results from the production method according to the invention, and which ensures bonding function. As will be seen in the following, this layer 13 can be interposed between the electrode 4 and the piezoelectric layer 2 of the stack E1.

Electrodes 10, 12 include an active part for tuning and one or more contact parts for connecting the active part to an external circuit.

Preferentially, the piezoelectric material has strong piezoelectric properties, quantified by an "electromechanical coupling coefficient" $k^2$ defined as the energy fraction converted from the electric field to the mechanical field, or vice-versa, with respect to the total (electric and elastic) energy available in the structure. The piezoelectric material is for example preferentially chosen from $LiNbO_3$, preferably X or Y+163°-cuts $LiNbO_3$, designated as LNO, $LiTaO_3$, or $KNbO_3$. Preferably, layers 2 and 8 are made of the same piezoelectric material. As a variant, both layers 2 and 8 can be made from two different piezoelectric materials, or even different crystal orientations.

The electrodes are for example of tungsten or aluminium. The electrodes can be made of different electrically conducting materials.

In the example represented, the stack includes an electrical insulator 14, for example $SiO_2$, interposed between both stacks E1 and E2, more particularly between the electrodes 6 and 10. But according to other alternatives, the electrodes 6 and 10 can be the same and only form a single metal layer.

The electrodes have a surface area lower than that of the face of the piezoelectric layer on which they are formed. The electrodes are for example made by full-plate deposition and etching.

By means of the method according to the invention, the surface area of the parts of the electrodes outside the active zone of the resonator is substantially reduced, with respect to resonators of the state of the art, and the parasitic capacitance is thereby reduced. The operation of the filter is then improved.

An exemplary production method according to the invention for producing the resonator of FIG. 1 will now be described.

Figure 2A:
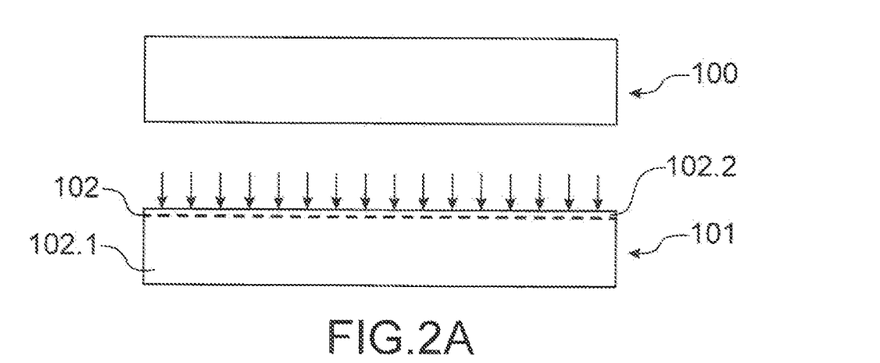
FIGS. 2A to 2O are schematic representations of the steps of an exemplary production method for producing the filter of FIG. 1.
Figure 2B:
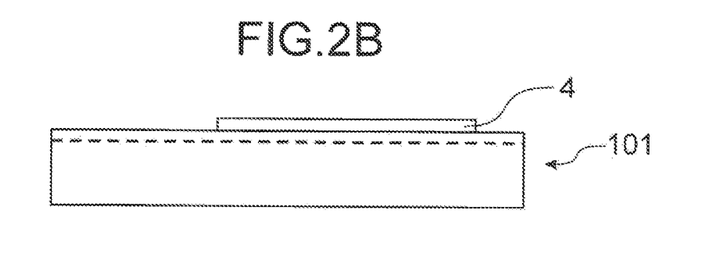
Figure 2C:
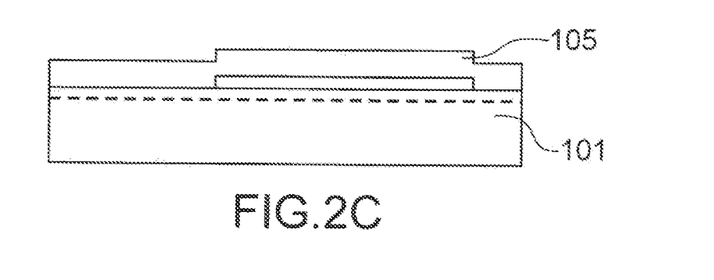
Figure 2D:
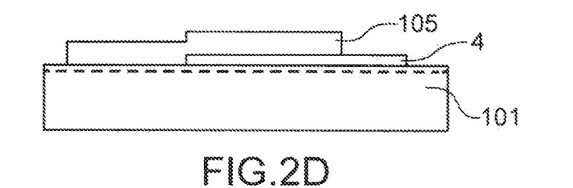
Figure 2E:
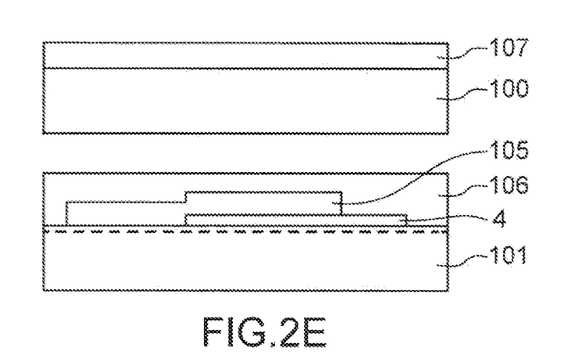
Figure 2F:
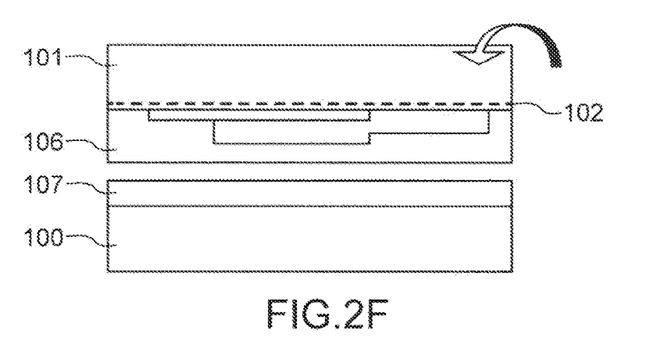
Figure 2G:
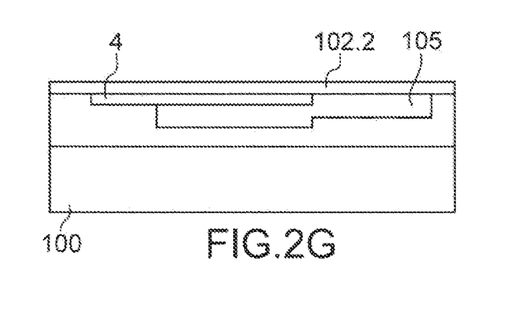
Figure 2H:
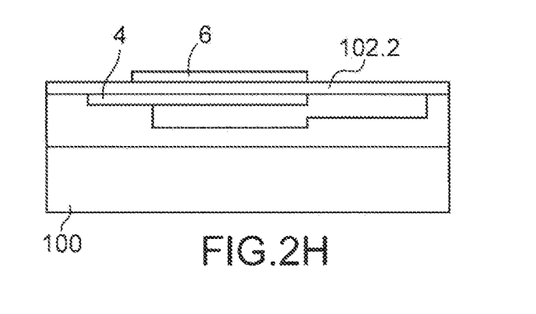
Figure 2I:
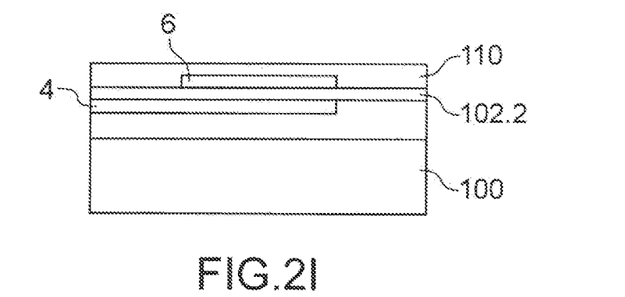
Figure 2J:
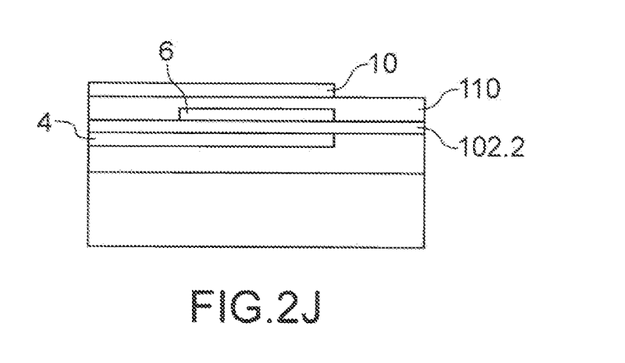
Figure 2K:
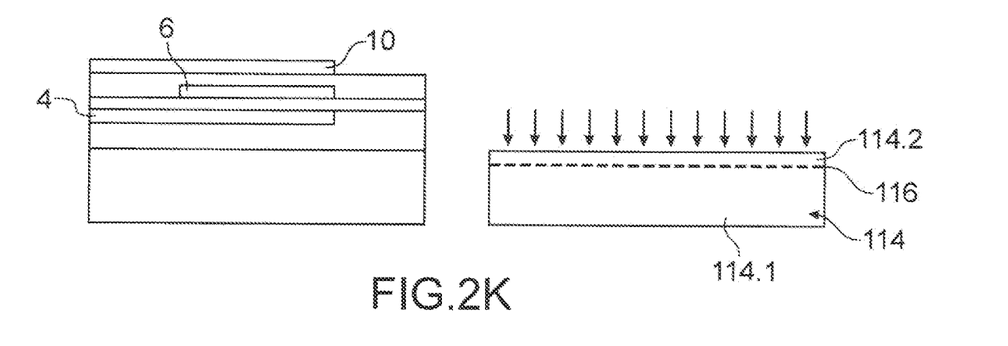
Figure 2L:
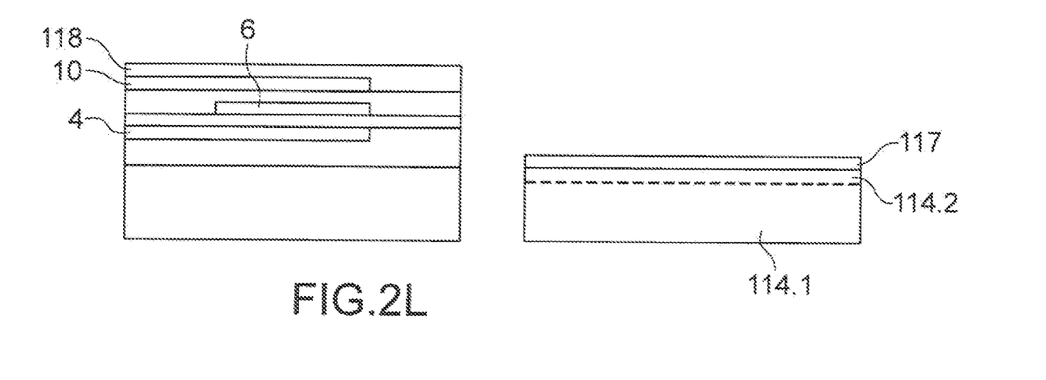
Figure 2M:
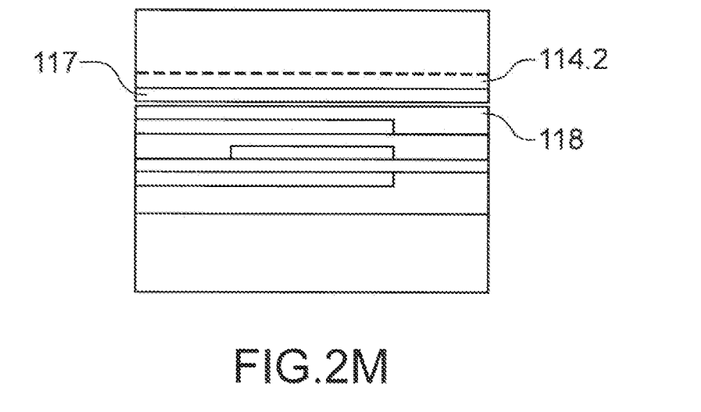
Figure 2N:
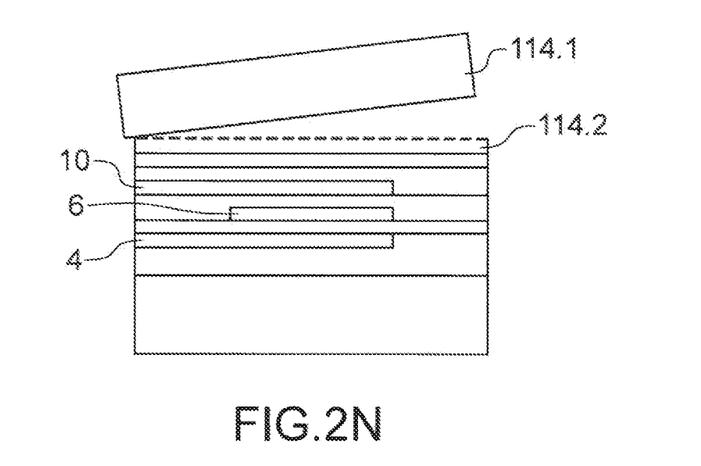
Figure 2O:
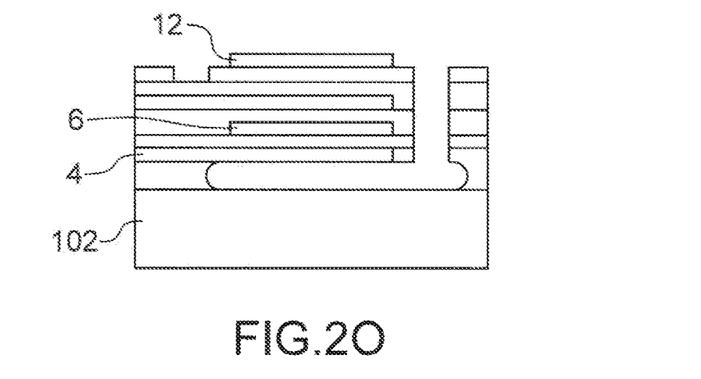

Steps are represented in FIGS. 2A to 2O.

This method enables LNO as thin layer as a piezoelectric material to be implemented. In the description that follows, the piezoelectric material implemented is LNO, but the method can implement other piezoelectric materials.

LNO thin layers have for example a thickness between about one hundred nm and a few hundred nanometres. The LNO thickness is chosen as a function of the target frequency range. Further, it is preferable that the LNO has a given crystal orientation: preferably, it is desired to have a X-cut LNO layer available.

But, unlike AlN, which is the material conventionally used in the bulk wave filter industry, but which has insufficient piezoelectric properties for an application in frequency agile filter, the production of LNO thin layers by deposition is not contemplatable.

In a first phase, the stack for forming the transducer is made. As a variant, the method could start with forming a stack for tuning. For this, a substrate 100 for example of silicon, and a substrate 101, for example of LNO, are used.

During a first step, ion implantation is made in the substrate 101 in order to create an embrittled zone 102 at a predetermined depth. The embrittled zone is depicted by a broken line. The embrittled zone 102 is made at a depth slightly higher than the desired thickness of the LNO layer in the stack, for example in the order of 50 to 200 nm higher than the target final thickness. The face of the substrate 101 which is closest to the embrittled zone is designated as front face. The embrittled zone 102 delimits the substrate into two parts 102.1 and 102.2, wherein part 102.2 is to form the LNO thin layer.

The element thus obtained is represented in FIG. 2A.

During a next step, a metal layer, for example of aluminium, tungsten, platine or molybdene is formed on the front face of the substrate 101, for example by sputtering deposition, in order to make an electrode. Then, the metal layer is structured for example by photolithography to make the defined electrode 4.

The element thus obtained is represented in FIG. 2B.

During a next step, a sacrificed layer 105 is formed on the electrode 4 and the front face, for example by depositing amorphous silicon by sputtering.

The element thus obtained is represented in FIG. 2C.

During a next step, the sacrificed layer 105 of amorphous silicon is structured, for example by reactive ion etching using fluorinated gases, for example $SF_6$ and/or $CH_2F_2$). This forms a box, which corresponds to the location of the future suspended membrane.

The element thus obtained is represented in FIG. 2D.

During a next step, a bonding layer 106, for example of $SiO_2$, is formed on the front face and the sacrificed layer 105.

On the substrate 100, a bonding layer 107, for example of $SiO_2$ is also formed.

A step of planarising the bonding layers 106 and 107 can then take place, for example by chemical-mechanical polishing.

The element thus obtained is represented in FIG. 2E.

During a next step, assembling both substrates is carried out by contacting the bonding layers 106 and 107, assembling is for example achieved through direct bonding. As a variant, assembling can be achieved by polymeric bonding: after forming boxes of sacrificed layer, spin coating of a resin, for example BCB (bisbenzocyclobutene) is performed. Contacting both substrates in a plate-to-plate alignment equipment, and finally an annealing enabling the resin to polymerise and cure are then carried out.

The element thus obtained is represented in FIG. 2F.

During a next step, the LNO layer is fractured at the implantation zone 102, so as to remove part 102.1.

An element is then obtained with a thin layer 102.2 of LNO and an electrode 4 on one of its faces.

Polishing can then advantageously be made in order to bring the thickness of the layer to the target value.

The element thus obtained is represented in FIG. 2G.

As a variant, the thin layer of LNO can be obtained by thinning the substrate 100 up to the desired thickness, by polishing without resorting to an implantation step.

During a next step, a layer of conducting material is formed on the thin layer 102.2 of LNO, and the layer is structured so as to form the defined electrode 6 aligned with the electrode 4. For example, during a photolithography and a mask aligner step, the electrode 6 is delimited such that it is aligned with the electrode 4. Then, by etching, the electrode 6 is defined. This alignment is made possible due to the transparent nature of the substrate and the oxide layer separating the substrate from the electrodes.

The element thus obtained is represented in FIG. 2H.

During a next step, a layer of electrically insulating material 110, for example of $SiO_2$ is formed on the electrode 6 for producing the tuning stack. The layer is formed on the entire front face of the element. This layer is to electrically insulate the transduction stack E1 and tuning stack E2.

The element thus obtained is represented in FIG. 2I.

During a next step, a layer of an electrically conducting material is deposited onto the layer 110, and the electrode 10 is structured such that it is aligned with the electrodes 4, 6.

This alignment can advantageously be achieved, for example by photolithography and a mask aligner, as has been described above for producing the electrode 6. The layer is then etched to define the electrode 10.

A resin removal, or stripping, step can then take place.

The element thus formed is represented in FIG. 2J.

Besides, in a third substrate 114 of LNO, ion implantation is performed in order to create an embrittled zone 116 at a predetermined depth. The embrittled zone is depicted by a broken line. The depth of the embrittled zone will define the thickness of the LNO layer in the tuning stack. The face of the substrate which is closest to the embrittled zone is designated as front face. The embrittled zone delimits the substrate in two parts 114.1 and 114.2, wherein part 114.2 is to form the thin layer of LNO. The element thus obtained is represented in FIG. 2K.

According to another example, the substrate 114 can be made of a piezoelectric material different from LNO.

A layer 118 of electrically insulating material, for example $SiO_2$ is then formed on the electrode 10. A planarisation step advantageously takes place, for example by chemical-mechanical polishing.

The element D2 thus obtained is represented in FIG. 2L.

During a next step, a layer 117 of electrically insulating material is formed on the front face of the substrate 114, for example of $SiO_2$. A planarisation step advantageously takes place, for example by chemical-mechanical polishing for bonding on element D2.

The element D1 is thus formed.

Elements D1 and D2 are represented in FIG. 2L.

During a next step, elements D1 and D2 are assembled by the layers 118 and 117, for example by direct bonding. This assembling step requires no alignment because the element D1 includes no electrode. The thicknesses of the layers 117 and 118 are chosen such that, upon assembling, the total thickness corresponds to the desired thickness of electrically insulating material between both stacks. The element thus obtained is represented in FIG. 2M.

During a next step, the part 114.1 of LNO is removed by fracturing.

As a variant, to form the thin layer of LNO, the substrate 114 is thinned by polishing, without resorting to an implantation step.

The element thus obtained is represented in FIG. 2N.

During a next step, a layer of electrically conducting material is formed, for example by deposition, on the thin layer 114.2 of LNO.

For example, by photolithography and by means of a mask aligner, the defined electrode 12 is delimited, such that it is aligned with the electrode 10, and then by an etching step, the electrode 12 is formed.

In the example represented and in a non-limiting way, successive etching steps of the piezoelectric layer 114.2 and of the insulating layer 110, and finally of the piezoelectric layer 114.2, the insulating layer 110 and the piezoelectric layer 102.2 are further made, all three for example by ion machining, in order to re-establish electric contacts on electrodes 10, 6 and 4 respectively. Finally, etching the entire stack with stopping in the sacrificed layer 105, still for example by ion machining, followed by gas phase etching the sacrificed layer 104, for example by $XeF2$ etching an amorphous silicon box, enables resonators suspended above an air film to be released.

The element thus obtained is represented in FIG. 2O.

This method can be implemented to produce a SMR resonator.

By means of this method, it is avoided to have to make an alignment between two plates upon bonding in order to align the different electrode levels with each other, the alignments being achieved by a mask aligner or a photorepeater during lithography, which is simpler and above all much more accurate. This method enables the manufacturing cost to be decreased, because it does not require to resort to a dedicated alignment station during bonding.

The production method according to the invention enables an accurate alignment of the electrodes to be achieved, which enables the margin usually adopted upon designing structures to overcome a possible misalignment to be decreased.

Figure 5A:
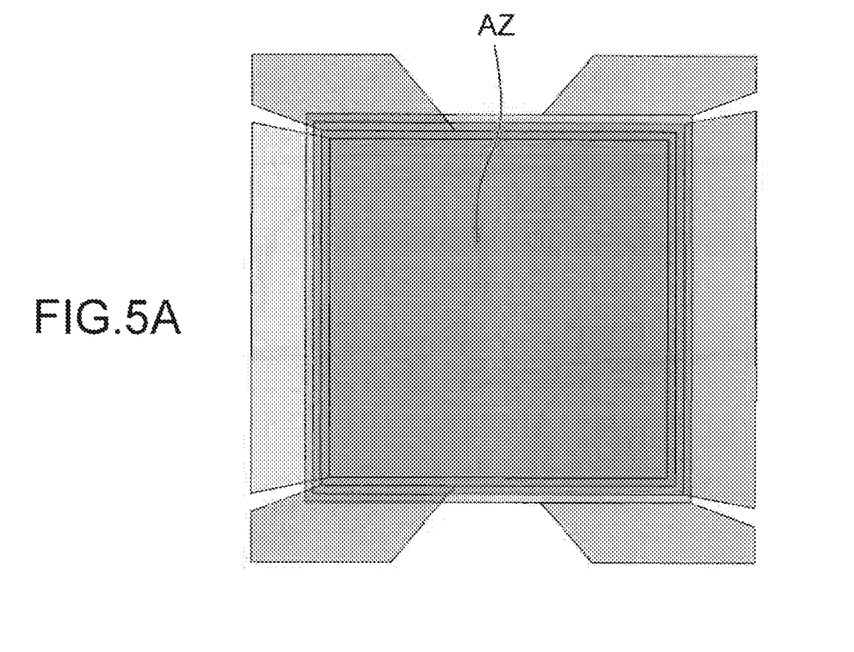
FIG. 5A is a top view representation of a filter of FIG. 1 obtained with the method according to the invention, in which only perimeters of the electrodes are represented.
Figure 5B:
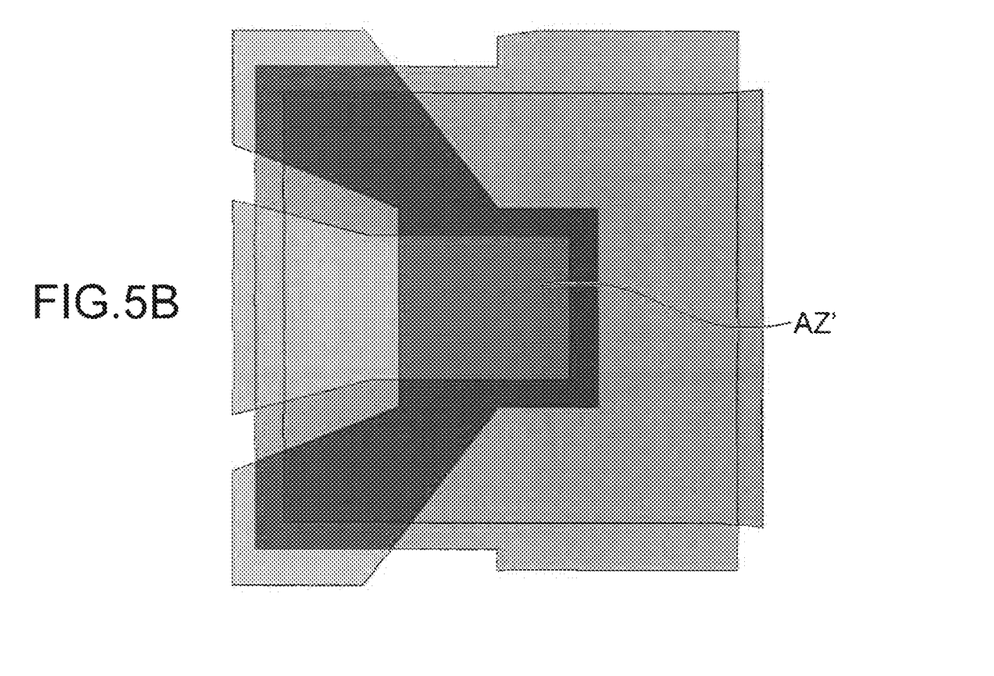
FIG. 5B is a top view representation of an adjustable bulk acoustic wave filter of the state of the art, in which only perimeters of the electrodes are represented.

By means of the invention, by assuming alignments made using photorepeaters, it is possible to contemplate guards to fill misalignments in the order of 1 μm between each metal level, which includes alignment uncertainties from level to level and dimension losses related to the lithography and etching steps. In FIG. 5A, a top view representation of a resonator obtained with the method according to the invention can be seen, wherein only the perimeters of the electrodes are represented, the active zone of the resonator, which corresponds to the common zone of the four electrodes, is designated as AZ. The guards are very reduced. In the figure, a top view representation of an adjustable bulk acoustic wave filter of the state of the art can be seen, wherein only the perimeters of the electrodes are represented. The common zone of the four electrodes is designated as AZ'.

Figure 3:
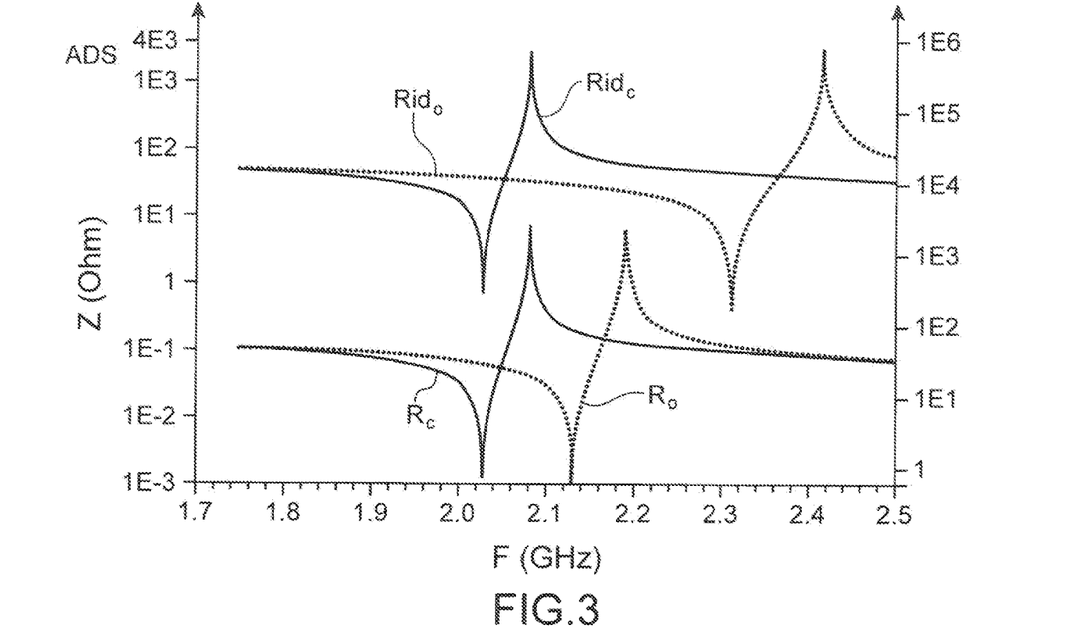
FIG. 3 is a graphic representation of electric responses (impedance I in Ohm) as a function of the frequency in GHz of an ideal resonator and a resonator R obtained by the method according to the invention.

In FIG. 3, electric responses (impedance Z in Ohm) can be seen represented as a function of the frequency of an ideal resonator Rid and a resonator R obtained according to the invention, including an intermediate layer 13 with a thickness of 60 nm. The curve Rido is the electric response when the tuning piezoelectric layer is in open circuit, and the RIdc is the electric response when the tuning piezoelectric layer is in short-circuit.

The curve Ro is the electric response when the tuning piezoelectric layer is in open circuit, and the Rc is the electric response when the tuning piezoelectric layer is in short-circuit.

Figure 4:
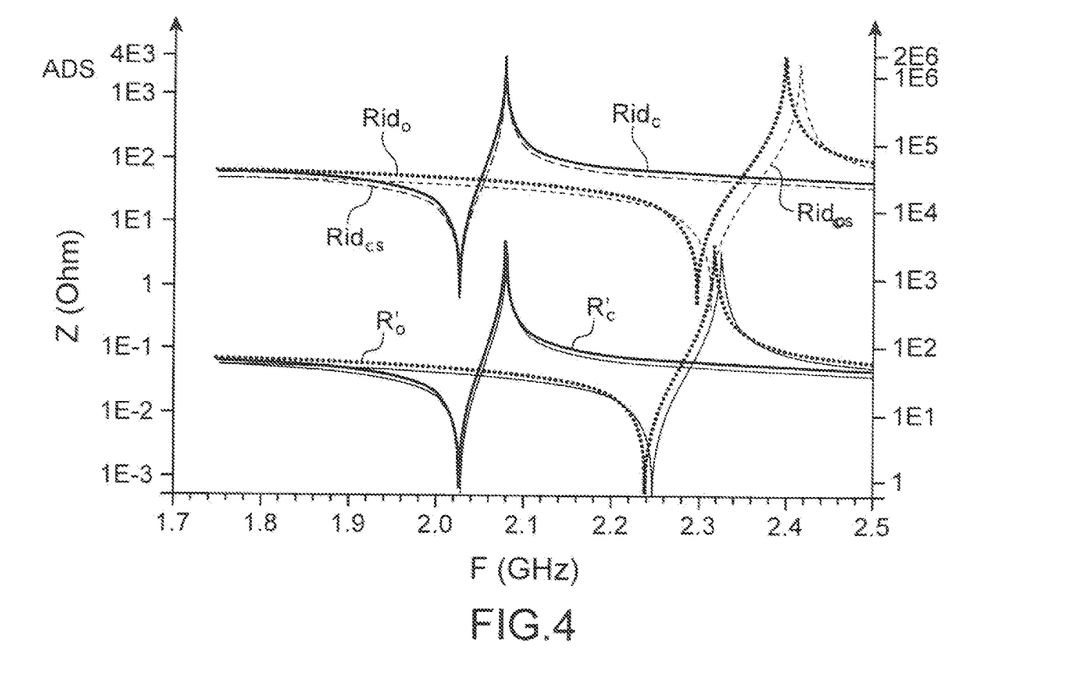
FIG. 4 is a graphic representation of electric responses (impedance I in Ohm) as a function of the frequency in GHz of an ideal resonator and a resonator R' obtained by a method of the state of the art.

In FIG. 4, by way of comparison, the electric response of a resonator R' of the state of the art the extension of the electrodes of which outside the active zone corresponds to a surface area 1.5 times the active zone can be seen represented. Therefore, it has a strong parasitic capacitance.

Curve R'o is the electric response when the tuning piezoelectric layer is in open circuit, and R'c is the electric response when the tuning piezoelectric layer is in short-circuit.

Doted-line curves Ridos and Ridcs correspond to the theoretical stacks having alignments achieved by means of the present invention but not implementing bonding layers. It is noticed that the presence of a bonding layer has not too high an effect on the operation of the resonator.

The open circuit and short-circuit conditions represent the two end positions reachable by the frequency agile resonator.

It is noticed that the frequency agility of the resonator achieved by the method according to the invention is reduced with respect to that of an ideal resonator, but this reduction is much lower than that of the resonator R' of the state of the art. Consequently, by means of the invention, adjustable bulk acoustic wave filters having an extended frequency agility with respect to those of the state of the art can be produced.

Moreover, due to the method according to the invention, the stack obtained by the method described above includes a bonding layer between one of the piezoelectric materials and an electrode. But this layer, which is generally of $SiO_2$, is electrically insulating.

The filters of the state of the art do not include such a layer. It is usually desired to contact electrodes directly with the piezoelectric layer. But the inventors have discovered that the presence of this layer was acceptable for the operation of the adjustable resonator.

In order to evaluate the effect of the presence of this intermediate layer on the operation of the filter, measurements have been made, considering the following filter:

electrodes 4, 6, 10, 12 are of Al, each with a thickness of 100 nm.

The tuning piezoelectric layer is of LNO with a thickness of 650 nm.

The layer of the transducer is of LNO with a thickness of 625 nm.

The electrically insulating layer between both stacks is of $SiO_2$ with a thickness of 200 nm and the bonding layer is of $SiO_2$ with a thickness h.

frO and faO designate resonant and anti-resonant frequencies when the tuning stack is in open circuit and frF and faF designate resonant and anti-resonant frequencies when the tuning stack is in closed circuit.

Figure 6:
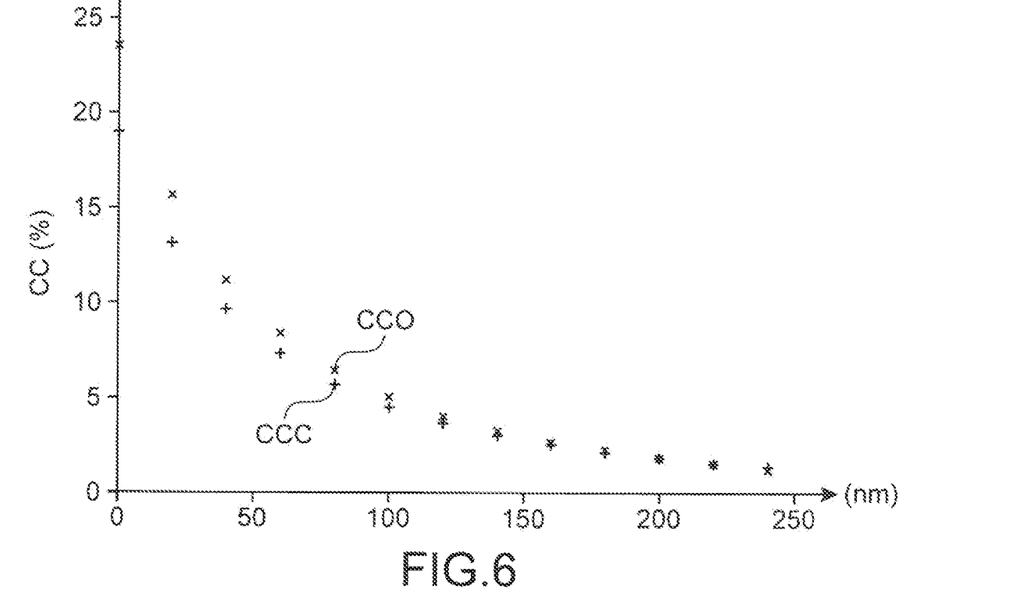
FIG. 6 is a graphic representation of the variation in the electromechanical coupling coefficient in % of an adjustable acoustic resonator, obtained by a method according to the invention as a function of the thickness h in nm of the intermediate layer

FIG. 6 represents the variation in the electromechanical coupling coefficient cc in % as a function of the thickness h in nm. cco designates the electromechanical coupling coefficient in open circuit and ccc designates the electromechanical coupling coefficient in short-circuit.

The electromechanical coupling coefficient represents the capability of the piezoelectric material to convert electric energy into mechanical energy and vice-versa. For a filtering application, this coefficient is proportional to the relative deviation between resonant and anti-resonant frequencies of the resonator, and consequently informs about the relative pass bands that are possibly reached.

It is noticed that the coefficient cc quickly decreases when the thickness of the intermediate layer increases. It would be preferable to choose a thickness h of at most 60 nm which is sufficient to ensure bonding. But under some conditions, such a thickness can make planarisation before bonding complex.

As a first approximation, the coefficient cc is proportional to the ratio of thickness between the piezoelectric layer to the total thickness.

Figure 7:
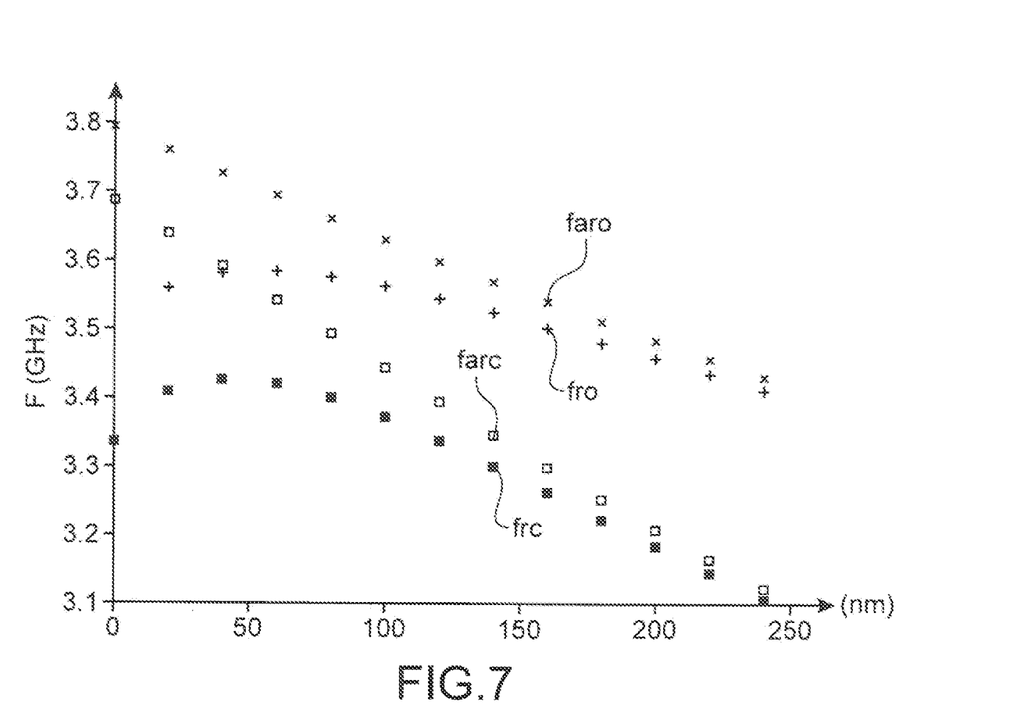
FIG. 7 is a graphic representation of the variation in the resonant and anti-resonant frequencies in GHz in open circuit and short-circuit, of the tuning layer of the adjustable acoustic resonator obtained by a method according to the invention, as a function of the thickness of the intermediate layer in nm.

In FIG. 7, the variation in the resonance fr and anti-resonance far frequencies in GHz in open circuit fro and faro and in short-circuit frc and farc of the tuning layer can be represented, as a function of the thickness of the intermediate layer 13 in nm. It is to be noted that stacks used for the measurements of FIG. 7 are different from those used for FIG. 3.

It is noticed that the frequency difference between the resonance frequencies in open circuit and the frequency difference between the anti-resonant frequencies in short-circuit increases with an increasing thickness of the intermediate layer. Thus, the filter agility increases with an increasing thickness. Consequently, the decrease in the coupling coefficient cc can be compensated for, or even increased, by modifying the ratio of the thicknesses between the tuning layer and the transduction layer, while keeping initial agility of the filter.

Reversely, if the intermediate layer is located against the transduction layer, a similar effect leads to an increase in the electromechanical coupling coefficient of the resonator.

By means of the method according to the invention implementing a bonding layer between an electrode and the piezoelectric layer, parasitic capacitances are reduced while modifying little or not coupling between the tuning layer and transduction layer.

Further, the bonding layer can advantageously improve the temperature behaviour of the resonator. Indeed, LNO is a material having a high temperature drift. Resonators implementing LNO are thus very sensitive to temperature. The presence of the bonding layer, for example of $SiO_2$, between the electrode and LNO ensures at least partial temperature compensation and makes the resonator less sensitive to temperature.

According to another exemplary embodiment, the method according to the invention enables bulk acoustic wave resonators on Bragg mirrors, called Solidly Mounted Resonators (SMR) which use an acoustic Bragg mirror to ensure mechanical decoupling between the resonator and the substrate to be produced.

The air cavity present in the adjustable resonator of FIG. 2O, is replaced with a stack of acoustic alternately high and low impedance layers.

Conventionally, these mirrors are generally made by using layers of $SiO_2$ as an acoustic low impedance material, and dense metals, for example W, Mo, . . . as an acoustic high impedance material. But the metal layers can form parasitic capacitances when they run under electric tracks. By means of the method according to the invention, it is possible to define them so as to reduce zones of metal layers which are not vertically aligned with the resonator.

An exemplary method according to the invention enabling a SMR resonator to be made will now be described using FIGS. 8A to 8J.

Figure 8A:
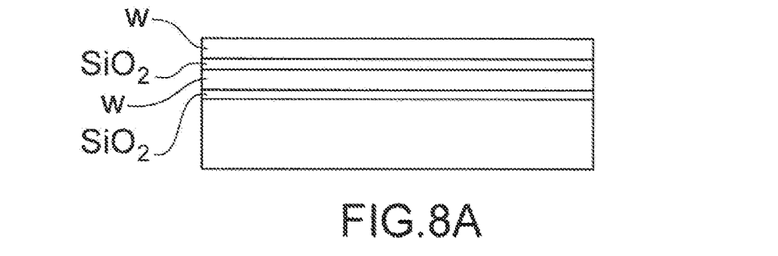
FIGS. 8A to 8J are schematic representations of the steps of an exemplary production method for producing a SMR filter.

During a first step, a $SiO_2/W/SiO_2/W$ stack for forming the Bragg mirror is made by a succession of PECVD (Plasma Enhanced Chemical Vapor Deposition). The successive depositions of $SiO_2$ and Mo can also be made by spraying for example.

The element thus obtained is represented in FIG. 8A.

Figure 8B:
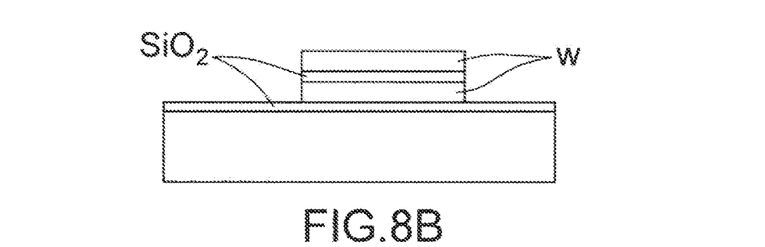

During a next step, a structuration of the mirror is for example made by photolithography, dry etching of the three layers of $W/SiO_2/W$.

The element thus obtained is represented in FIG. 8B.

Figure 8C:
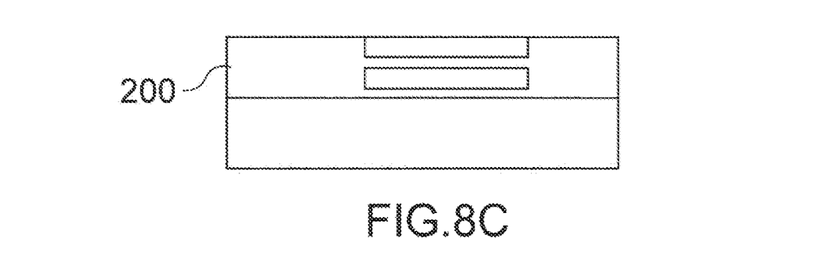

During a next step, the $SiO_2$ layer 200 is formed, and a planarisation step is then carried out.

The element thus obtained is represented in FIG. 8C.

Figure 8D:
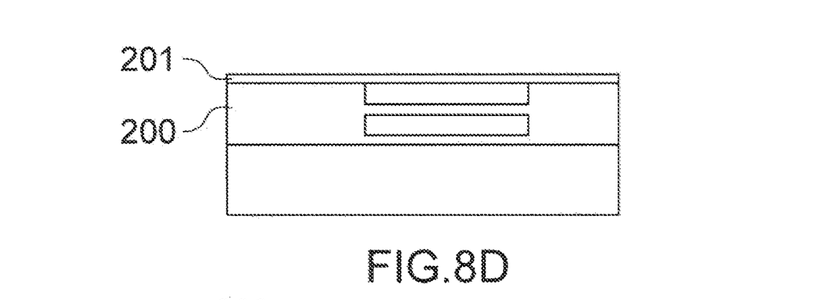

During a next step, another $SiO_2$ layer 201 is formed.

The element thus obtained is represented in FIG. 8D.

Figure 8E:
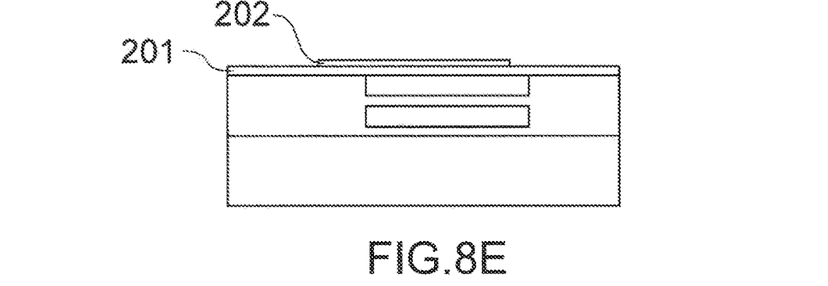

During a next step, an electrically conducting layer 202 is formed on the layer 200, for example of Mo. This layer is then structured to form a first defined electrode, for example by photolithography, dry etching and resin removal.

The element thus obtained is represented in FIG. 8E.

Figure 8F:
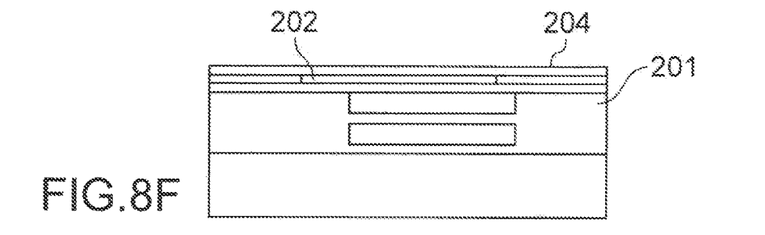

During a next step, a $SiO_2$ layer 204 is formed on the first electrode, for bonding with an LNO substrate. A planarisation step can take place.

The element thus obtained is represented in FIG. 8F.

Figure 8G:
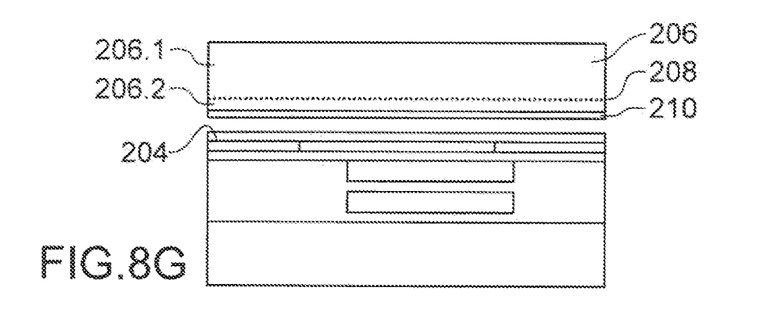

Besides, an ion implantation of a substrate 206 of LNO is made in order to create an embrittled zone 208 at a predetermined depth. The embrittled zone is depicted by a broken line. The depth of the embrittled zone will define the thickness of LNO layer of the resonator. The face of the substrate which is closest to the embrittled zone is designated as the front face. The embrittled zone delimits the substrate in two parts 206.1 and 206.2, wherein part 206.2 is to form the thin layer of LNO.

A $SiO_2$ layer 210 is then formed on the front face of the substrate 206 for bonding with the element. A planarisation step can take place, followed by surface activation to promote the subsequent bonding step.

The element thus obtained is represented in FIG. 8G.

Figure 8H:
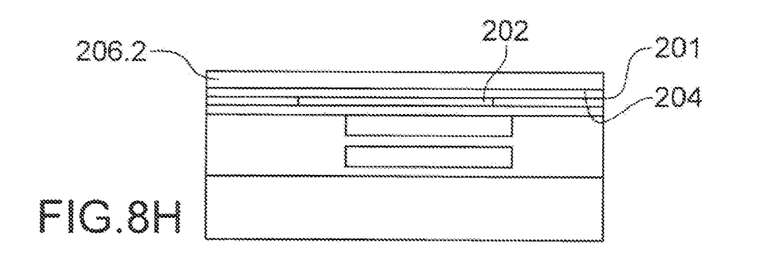

During a next step, both elements are assembled by bonding the layers 204 and 210, for example by direct bonding. A reinforcing annealing, followed by a fracturing annealing are then carried out. Substrate 206.1 is removed. A planarisation step and/or healing annealing, for healing defects generated by implantation and fracturing in the transferred layer, can take place.

The element thus obtained is represented in FIG. 8H.

Figure 8I:
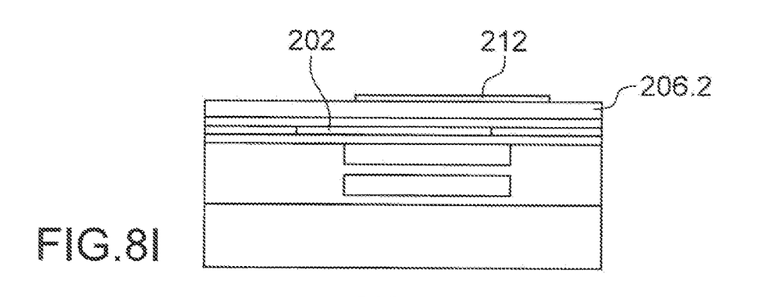

During a next step, a layer of electrically conducting material 212, for example of Mo, is formed for example by spraying.

For example by photolithography and by means of a mask aligner, the second defined electrode is delimited such that it is aligned with the first electrode, and then by an etching, for example dry etching step, the second electrode is formed.

The element thus obtained is represented in FIG. 8I.

Figure 8J:
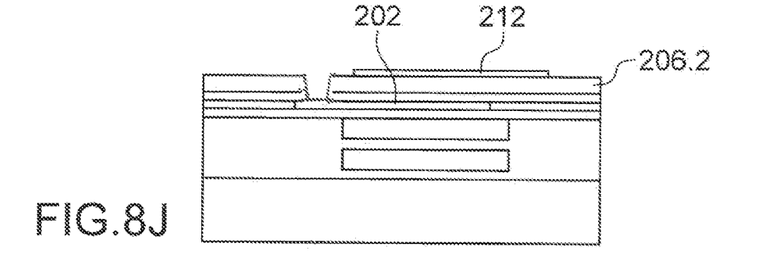

During a next step, the LNO layer is structured by photolithography, ion beam etching, and then resin removal.

The element thus obtained is represented in FIG. 8J.

By means of the method according to the invention, portions of conducting layers of the mirror which are not vertically aligned with the electrodes of the resonator are minimised. Electrical parasites are thus reduced.

In FIGS. 9A to 9E, an exemplary method according to the invention for producing a structure which includes at least a first stack and a second stack can be seen.

For example, the first and the second stack are each an actuator. As a variant, one of the stacks is an actuator, and the other stack is a structure to be moved.

According to an example, the structure can be implemented in a pyroelectric detector, the first stack can then be the pyroelectric sensor, and the second stack can be the read circuit. According to another example, the structure can be implemented in a microelectronic system, each stack can be a circuit.

Figure 9A:
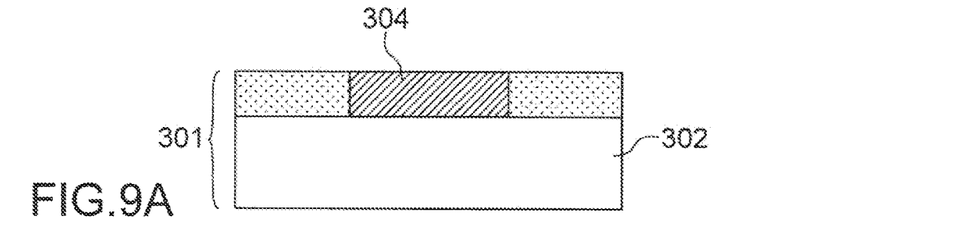
FIGS. 9A to 9E are schematic representations of steps of an exemplary method for the production of a structure including at least one first element, a second stack including at least one second element, the first and the second element being aligned with each other.

The first stack 301 includes a first element or structure 304 and a first part 302 which are to cooperate together, and the second stack 310 includes a second element or second structure 306 and a second part 311 which are to cooperate together, the first element 304 being aligned with the second element 306.

Firstly, there is for example a first stack 301 (FIG. 9A) including a substrate 302, called an acceptor substrate, and a defined structure 304 formed on this substrate.

Figure 9B:
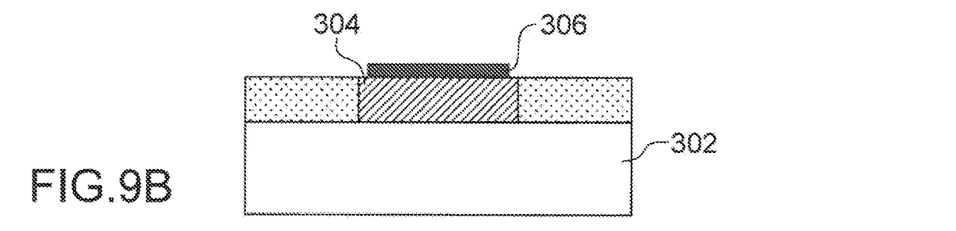

During a first step, an element or structure 306 is formed on the structure 304 such that both structures 304 and 306 are aligned with each other. This formation is for example made by deposition and photolithography.

The element thus obtained is represented in FIG. 9B.

Figure 9C:
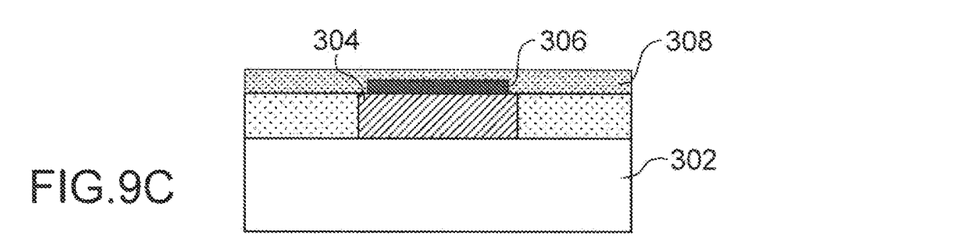

During a next step, a bonding layer 308, for example of $SiO_2$, is formed on the front face of the element of FIG. 9B.

The element thus obtained is represented in FIG. 9C.

Figure 9D:
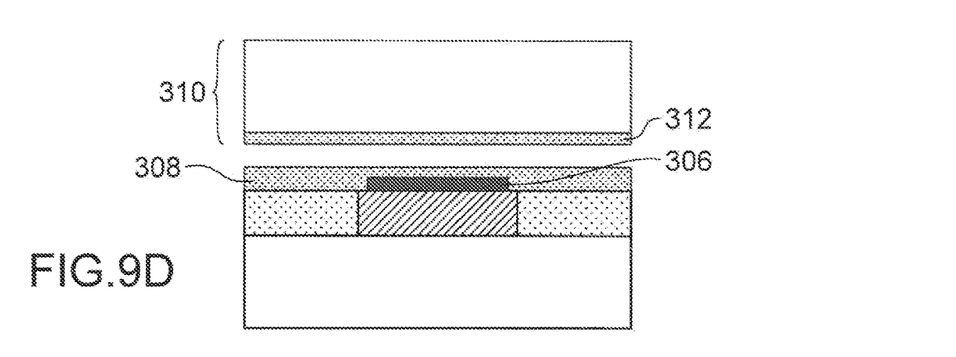

On a second stack 310 including a substrate 311, called a donor substrate, not including the structure 306, a bonding layer 312, for example of $SiO_2$ is also formed.

A step of planarising the bonding layers 308 and 312 can then take place, for example by chemical-mechanical polishing.

The element thus obtained is represented in FIG. 9D.

Figure 9E:
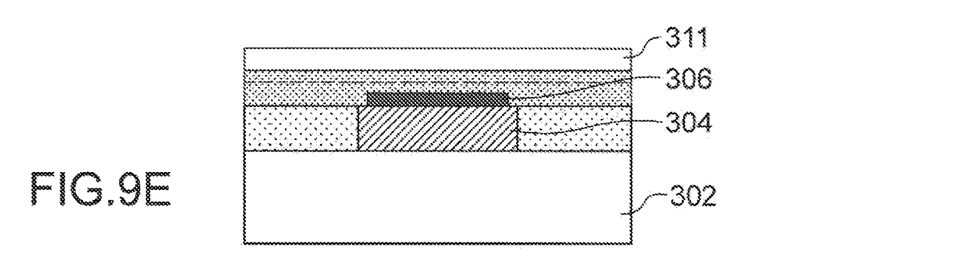

During a next step, assembling both substrates is carried out by contacting the bonding layers 308 and 310 together, assembling is for example achieved by direct bonding. As a variant, assembling can be achieved by polymeric bonding, spin coating a resin, for example BCB (bisbenzocyclobutene) is carried out. Contacting both substrates in a plate-to-plate alignment equipment, and finally annealing enabling the resin to polymerise and cure are then carried out.

During a next step, the thickness of the substrate 311 can be reduced, for example by fracturing at an implantation zone.

A polishing step can advantageously be made before bringing the thickness of the layer to the target value.

The element thus obtained is represented in FIG. 9E.

As a variant, the substrate 311 can be thinned by polishing without resorting to an implantation step.

This method enables, by way of example, actuators, detectors for example pyroelectric detectors, microelectronic systems . . . to be made.

Further, the production method according to the invention does not require to perform steps (mainly deposition steps) requiring high thermal budgets to be made on implanted plates. It is thus possible to have metal or insulating layers deposited at high temperatures and thus having low acoustic losses, which was not possible according to known techniques of the state of the art. Further, it does not generate relatively high cumulative stresses in the stacks.

The present invention is also applicable to the production of a structure including a stack with several elements in a plane which are each aligned with an element of the other stack.

The invention claimed is:

1. A method for a production of an acoustic resonator including at least a first functional stack and a second functional stack, the first functional stack including at least one first element consisting of a first layer of piezoelectric or dielectric material interposed between two structured electrically conducting layers, a coverage surface of the two structured electrically conducting layers defining a first active zone, the second functional stack including at least one second element consisting of a second layer of piezoelectric material interposed between a first and a second electrode, a coverage surface of the first and second electrodes defining a second active zone, said method including:
providing the first functional stack including the first layer of piezoelectric or dielectric material as well as both the structured electrically conducting layers associated with each other defining the first active zone,
forming the first electrode of the second functional stack on the first functional stack, so as to align the first electrode with the first active zone, and forming a first bonding layer of an electrically insulating material on the first electrode,
providing a part of the second functional stack comprising at least one second bonding layer of an electrically insulating material and the second layer of piezoelectric material,
assembling the first functional stack and the part of the second functional stack comprising at least one second bonding layer and the second layer of piezoelectric material by contacting the first and at least one second bonding layers,
forming the second electrode of the second functional stack, so as to define the second active zone in alignment with the first active zone.

2. The production method according to claim 1, wherein assembling between the first functional stack and the part of the second functional stack is direct bonding.

3. The production method according to claim 1, wherein the first and the at least one second bonding layers are of a further dielectric material.

4. The production method according to claim 1, wherein the first and at least one second bonding layers are such that they form an intermediate layer with a thickness between 10 nm and 50 nm.

5. The production method according to claim 1, wherein the alignment of the first electrode with the first active zone and the production of the second electrode so as to align the second active zone with the first active zone are achieved by implementing a mask aligner or a photorepeater during a photolithography step.

6. The production method according to claim 1, wherein the first functional stack is a transducer and the second functional stack including the second layer of piezoelectric material forms frequency tuning means for said transducer.

7. The production method according to claim 6, including, before forming the second functional stack, a step of removing a portion of a given thickness of the second layer of piezoelectric material of the second stack up to a given thickness.

8. The production method according to claim 7, wherein the step of removing the portion with the given thickness of the second layer of piezoelectric material is achieved by fracturing the second layer of piezoelectric material of the second functional stack, said second layer of piezoelectric material having undergone beforehand an ion implantation to a depth slightly higher than a given depth of the first layer of piezoelectric material of the first functional stack.

9. The production method according to claim 6, wherein the first functional stack includes a support substrate supporting the two structured electrically conducting layers and the first layer of the piezoelectric material.

10. The production method according to claim 9, including a step of structuring the support substrate to form a cavity under the acoustic resonator.

11. The production method according to claim 10, wherein the step of structuring the support substrate to form the cavity under the resonator comprises etching a sacrificial layer.

12. The production method according to claim 6, wherein the first layer of piezoelectric material is produced by ion implantation and fracturing.

13. The production method according to claim 1, wherein the first functional stack forms a Bragg mirror and the first stack and the second functional stack form a bulk acoustic wave resonator on the Bragg mirror.

14. The production method according to claim 13, wherein the first layer and/or the second layer of piezoelectric material are of X-cut lithium niobate.

15. The production method according to claim 14, wherein the first layer and/or the second layer of piezoelectric material have a thickness from 100 nm to several hundred nm.

16. The production method according to claim 13, wherein the first and/or the second layer of piezoelectric material is (are) of Y+163°-cut lithium niobate.

17. The production method according to claim 16, wherein the first and/or the second layer of piezoelectric material have a thickness from 100 nm to several hundred nm.

* * * * *